US006993694B1

(12) United States Patent
Kapur et al.

(10) Patent No.: US 6,993,694 B1
(45) Date of Patent: Jan. 31, 2006

(54) DETERMINISTIC BIST ARCHITECTURE INCLUDING MISR FILTER

(75) Inventors: Rohit Kapur, Cupertino, CA (US); Thomas W. Williams, Boulder, CO (US); Tony Taylor, Mountain View, CA (US); Peter Wohl, Williston, VT (US); John A. Waicukauski, Tualatin, OR (US)

(73) Assignee: Synopsys, Inc., Mountain View, CA (US)

( * ) Notice: Subject to any disclaimer, the term of this patent is extended or adjusted under 35 U.S.C. 154(b) by 524 days.

(21) Appl. No.: 10/117,747

(22) Filed: Apr. 5, 2002

Related U.S. Application Data

(63) Continuation-in-part of application No. 09/950,292, filed on Sep. 7, 2001.

(51) Int. Cl.
*G01R 31/28* (2006.01)
*G01R 31/08* (2006.01)
(52) U.S. Cl. ...................... 714/733; 324/527
(58) Field of Classification Search ................ 714/724, 714/726–729, 730, 732, 811, 815; 324/527
See application file for complete search history.

(56) References Cited

U.S. PATENT DOCUMENTS

| 5,774,477 A | * | 6/1998 | Ke .............................. 714/727 |
| 6,148,425 A | | 11/2000 | Bhawmik et al. |
| 6,463,561 B1 | | 10/2002 | Bhawmik et al. |

OTHER PUBLICATIONS

"Low Cost Concurrent Test Implementation for Linear Digital Systems" by Bayraktaroglu et al. IEEE European Test Workshop Proceedings, 2000 Publication Date: May 23-26, 2000 p. 140-143 Inspec Accession No.: 6788978.*

"LFSR-Coded Test Patterns for Scan Designs" by Dr. Bernd Könemann; 6 pgs.

"Logic DFT and Test Resource Partitioning for 100M Gate ASICs Part I: Current Chip-Level DFT Methodology Overview" by Bernd Könemann et al.; pp. 1-4.

"Logic DFT and Test Resource Partitioning for 100M Gate ASICs Part II: LBIST Overview" by Bernd Könemann et al.; pp. 1-5.

"Logic DFT and Test Resource Partitioning for 100M Gate ASICs Part III: SmartBIST™ Roadmap" by Bernd Könemann et al.; pp. 1-5.

"A Pattern Skipping Method for Weighted Random Pattern Testing" by Bernd Könemann; pp. 418-425.

* cited by examiner

*Primary Examiner*—Guy Lamarre
*Assistant Examiner*—Cynthia Britt
(74) *Attorney, Agent, or Firm*—Bever, Hoffman & Harms, LLP; Jeanette S. Harms

(57) ABSTRACT

A filter for preventing uncertain bits output by test scan chains from being provided to a MISR is provided. The filter can include a gating structure for receiving a bit from a scan chain and control circuitry for providing a predetermined signal to the gating structure if the bit is an uncertain bit. In one embodiment, the gating structure can include a logic gate, such as an AND or an OR gate. The control circuitry can include components substantially similar to the pattern generator providing signals to the scan chain. For example, the control circuitry can include an LFSR and a PRPG shadow for loading the LFSR. In one embodiment, the control circuitry can further include a phase-shifter for receiving inputs from the LFSR and providing outputs to the gating structure.

12 Claims, 17 Drawing Sheets

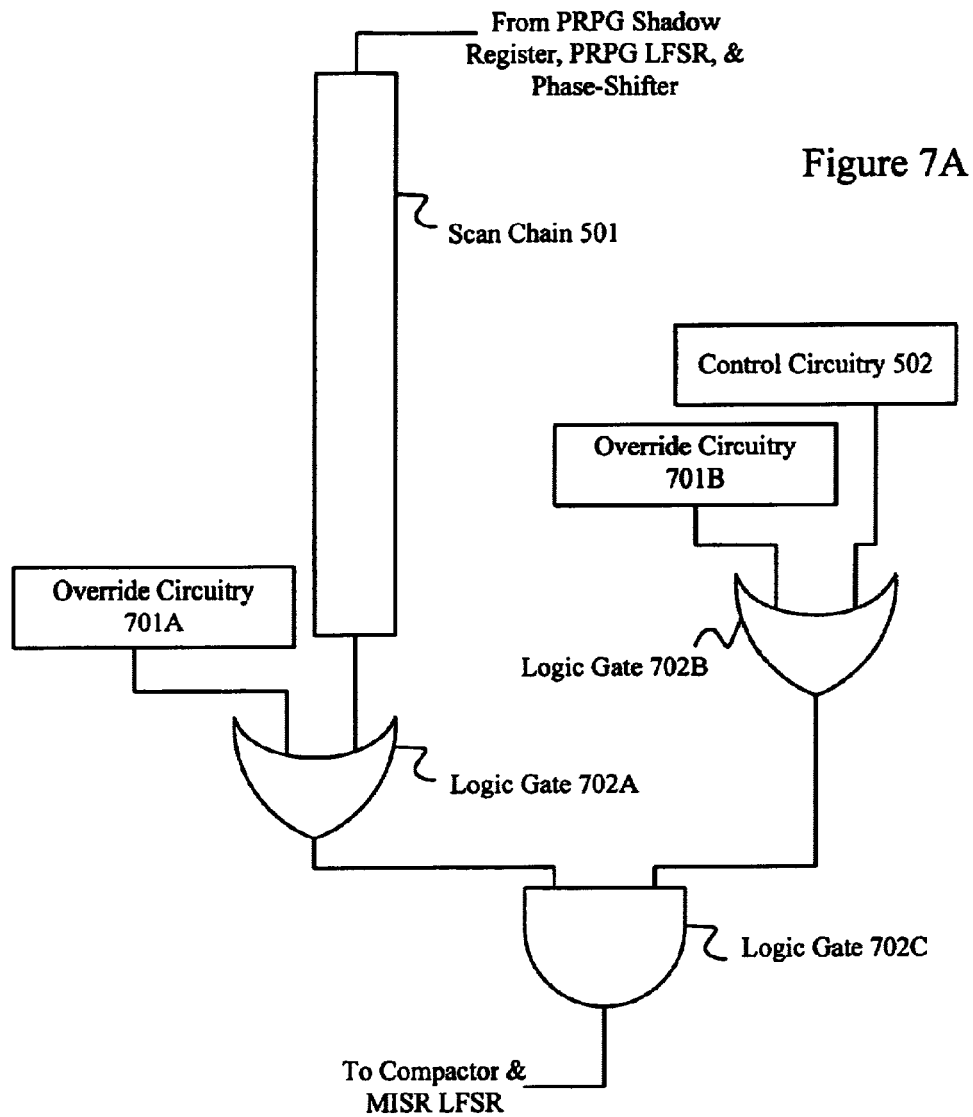

DETERMINISTIC BIST ARCHITECTURE INCLUDING MISR FILTER

RELATED APPLICATIONS

The present application is a continuation-in-part of commonly owned co-pending U.S. patent application Ser. No. 09/950,292, "EFFICIENT COMPRESSION AND APPLICATION OF DETERMINISTIC PATTERNS IN A LOGIC BIST ARCHITECTURE" filed Sep. 7, 2001 by Peter Wohl, John A. Waicukauski and Thomas W. Wiliams.

BACKGROUND OF THE INVENTION

1. Field of the Invention

The embodiments of the present invention relate to a deterministic built-in self test (BIST) architecture, and particularly to filtering values output by the scan chains of the tested design.

2. Description of the Related Art

Larger and more complex logic designs in integrated circuits (ICs) lead to demands for more sophisticated testing to ensure fault-free performance of those ICs. This testing can represent a significant portion of the design, manufacture, and service cost of integrated circuits (ICs). In a simple model, testing of an IC can include applying multiple test patterns to the inputs of a circuit and monitoring its outputs to detect the occurrence of faults. Fault coverage indicates the efficacy of the test patterns in detecting each fault in a universe of potential faults. Thus, if a set of test patterns is able to detect substantially every potential fault, then fault coverage approaching 100% has been achieved.

To facilitate better fault coverage and minimize test cost, DFT (design-for-test) can be used. In one DFT technique, structures in the logic design can be used. Specifically, a logic design implemented in the IC generally includes a plurality of state elements, e.g. sequential storage elements like flip-flops. These state elements can be connected into scan chains of computed lengths, which vary based on the design. In one embodiment, all state elements in a design are scannable, i.e. each state element is in a scan chain. The state elements in the scan chains are typically called scan cells. In DFT, each scan chain includes a scan-input pin and a scan-output pin, which serve as control and observation nodes during the test mode.

The scan chains are loaded by clocking in predetermined logic signals through the scan cells. Thus, if each scan chain includes 500 scan cells, then 500 clock cycles are used to complete the loading process. Note that, for simplicity, the embodiments provided herein describe scan chains of equal length. In actual embodiments, DFT attempts to create, but infrequently achieves, this goal. Thus, in actual embodiments, software can compensate for the different scan chain lengths, thereby ensuring that outputs from each test pattern are recognized and analyzed accordingly. This methodology is known by those skilled in the art and therefore is not explained in detail herein.

The test patterns for the scan chains can be generated using an external testing device. Using such a device, an exhaustive test can be done by applying $2^N$ input patterns to a design with N inputs and scan cells. However, this test approach rapidly becomes commercially impractical as the number of inputs increases.

To solve this problem, deterministic automatic test pattern generation (ATPG) can be used to generate the minimum set of patterns while providing fault coverage close to 100%. Specifically, in deterministic ATPG, each test pattern is designed to test for the maximum number of faults. However, even with the reduction in test patterns, deterministic ATPG patterns still require significant storage area in the test-application equipment (tester) for the large number of patterns that are input directly to the scan chains, and for the expected output values from the scan chains. Moreover, this test method has associated inefficiencies because of its off-chip access time.

Alternatively, and more frequently in current, complex ICs, structures can be added to the design that allow the IC to quickly test itself. These built-in self-test (BIST) structures can include various pattern generators, the most typical being a pseudorandom pattern generator (PRPG). After the patterns generated by the PRPG are propagated through the scan chains in the tested design, the outputs are analyzed to determine if a fault is detected.

FIG. 1A illustrates a logic BIST architecture 100 for testing a design 130 having six scan chains 131–136. In this embodiment, architecture 100 includes a linear feedback shift register (LFSR) 110 to implement the PRPG. PRPG-LFSR 110 includes a plurality of sequential storage elements (in a typical embodiment, flip-flops) 111–114 that are connected in series with a feedback loop and one XOR operation (indicated by the circled plus sign). As shown in FIG. 1A, the flow of signals in these interconnected flip-flops is from left to right. Note that a linear feedback shift register has a characteristic polynomial that is expressed in terms of its feedback connections. In this embodiment, PRPG-LFSR 110 implements the polynomial $f(x)=x^4+x^3+1$. Other embodiments can implement other polynomials, preferably primitive polynomials.

As shown in FIG. 1B, if an LFSR 180 generates bit sequences, i.e. the test patterns, directly for scan chains 181–184, then those bit sequences differ by only a few bits, i.e. phase shifts. These small phase shifts can undesirably reduce the fault coverage. As a result, in architecture 100 (FIG. 1A), a phase shifter 120 is provided to transform the outputs of PRPG-LFSR 110 into uncorrelated signals. Phase shifter 120 is described in further detail in "Built-In Test for VLSI: Pseudorandom Techniques", by P. H. Bardell et al., page 176, John Wiley & Sons, 1987. Thus, the values from PRPG-LFSR 110 are loaded into scan chains 131–136 in a manner controlled by the various XOR operations in phase shifter 120. In this embodiment, scan chain 131 includes an input scan pin si1 and an output scan pin so1. Scan chains 132–136 include corresponding scan pins si2/so2, si3/so3, si4/so4, si5/so5, and si6/so6, respectively.

Compactor 140 compacts the outputs from tested design 130 and provides inputs to a multiple input signature register (MISR) LFSR 150, which includes a plurality of storage elements 151–154 coupled in series with various XOR operations and feedback loops. In this embodiment, MISR-LFSR 150 implements the polynomial $f(x)=x^4+x+1$. After several cycles, MISR-LFSR 150, described in further detail in "Built-In Test for VLSI: Pseudorandom Techniques", by P. H. Bardell et al., page 119, John Wiley & Sons, 1987, provides a "signature" that is a near-unique checksum for a given sequence of its input values. At this point, the state of MISR-LFSR 150 can be compared to the known "signature" of the fault-free design, wherein a mismatch indicates that at least one erroneous value was unloaded from scan chains 131–136. This erroneous value can be used to determine that a fault exists in tested design 130.

FIG. 1C illustrates a graph plotting fault coverage versus number of pseudorandom test patterns. As seen in FIG. 1C, pseudorandom pattern generation has two disadvantages. First, the final fault coverage is signficantly less than 100%.

Generally, a PRPG provides fault coverage in the range of 70–80%, which is unacceptable for many IC applications. Moreover, as the number of test patterns increases, the detection of faults becomes significantly less efficient. Specifically, pseudorandom pattern generation is very efficient in removing easy-to-detect faults from a fault list in the beginning of the test process, but is less efficient in removing hard-to-detect (i.e. circuit dependent) faults near the end of the test process. In fact, to achieve acceptable test coverage, the number of PRPG patterns must be significantly larger than the number of deterministic ATPG patterns to provide the same fault coverage. Therefore, using PRPG forces a trade-off between reduced test coverage and reduced tester storage data.

Several solutions have been proposed to address this problem, each having associated disadvantages. In one solution, the number of scan chains can be increased, thereby reducing the number of pattern load/unload clock cycles. However, the tester storage volume is still unreasonably large for typical industry applications. In a second solution, test points can be added to the design, thereby increasing the probability of fault detection by pseudorandom patterns. This solution is undesirable because it increases silicon area and the propagation delay of critical timing paths. In a third solution, the pseudorandom patterns can be biased or modified to test for random-resistant faults. However, this solution adds significant silicon area to the design and/or increases data volume stored in the tester. In a fourth solution, deterministic ATPG patterns can be added to BIST patterns for a more complete test coverage. However, this solution significantly increases the data volume stored in the tester.

Finally, in a fifth solution, the PRPG is initialized, i.e. seeded, such that predetermined scan cells are set to values, after a suitable number of cycles of the PRPG, that achieve detection of targeted faults. The values stored in these predetermined scan cells, called "care bits", are typically much fewer (i.e. on the order of hundreds) than the "don't care bits" (i.e. on the order of hundreds of thousands) stored in the other scan cells. This solution is described in further detail in "LFSR-Coded Test Patterns for Scan Designs", by B. Könemann, Munich 1991. Although improving test coverage, this solution requires storing a significant number of seeds for the PRPG to detect the care bits, thereby undesirably increasing the amount of stored data. Additionally, this solution requires serially loading the seeds into the PRPG. In FIG. 1A, four clock cycles are needed to load PRPG-LFSR 110. However, an actual implementation of PRPG-LFSR 110 could include hundreds of storage elements, thereby requiring a corresponding number of cycles to load. Thus, this solution can also significantly increase the test application time. Therefore, a need arises for a pseudorandom pattern generation system and method that minimizes test application time while achieving fault coverage comparable to deterministic ATPG.

Moreover, referring back to FIG. 1A, which illustrates a standard logic BIST architecture 100, tested design 130 can occasionally output uncertain outputs that can corrupt the signature generated by MISR LFSR 150. These uncertain outputs can be caused by floating buses, race conditions, and un-initialized components in the design. Although tested design 130 can be modified to eliminate these uncertain outputs, the inconvenience and inefficiency of changing the design merely for test purposes renders such additional step(s) highly undesirable. Therefore, a further need arises for a system and method that filters the outputs of the scan chains, thereby ensuring that any uncertain outputs are not provided to the MISR.

SUMMARY OF THE INVENTION

In accordance with one feature of the invention, a filter for preventing uncertain bits output by test scan chains from being provided to a MISR is provided. The filter can include a gating structure for receiving a bit from a scan chain and control circuitry for providing a predetermined signal to the gating structure if the bit is an uncertain bit. In one embodiment, the gating structure can include a logic gate, such as an AND or an OR gate. The control circuitry can include components substantially similar to the pattern generator providing signals to the scan chain. For example, the control circuitry can include an LFSR and a PRPG shadow for loading the LFSR. In one embodiment, the control circuitry can further include a phase-shifter for receiving inputs from the LFSR and providing outputs to the gating structure.

The filter can also include a first override component for masking a bit from the scan chain with a predetermined logic value. The first override component can include a first logic gate for receiving the bit from the scan chain as well as override circuitry for providing an output to the first logic gate, wherein the first logic gate provides an output to the gating structure. The filter can also include a second override component for deactivating the control circuitry. The second override component can includes a second logic gate for receiving a signal from the control circuitry and override circuitry for providing an output to the second logic gate, wherein the second logic gate provides an output to the gating structure.

A system for testing a design implemented in an integrated circuit (IC) is also provided. The design implemented in the IC includes a plurality of scan chains. The system can include a first set of shadow registers, wherein each shadow register includes a first plurality of storage elements serially coupled. The system can further include first means for generating a pseudorandom pattern from values stored in the first plurality of storage elements, wherein the pseudorandom pattern is provided to the plurality of scan chains. The system can advantageously include a filter for eliminating any uncertain output signals of the scan chains. Finally, the system can include means for providing a signature from output signals of the filter.

In one embodiment, the filter can include a second set of shadow registers, wherein each shadow register includes a second plurality of storage elements serially coupled. The filter can further include second means for generating a pseudorandom pattern from values stored in the second plurality of storage elements. Finally, the filter can include a plurality of logic gates for receiving the pseudorandom pattern and signals output by the plurality of scan chains. In another embodiment, the filter can further include override circuitry coupled in operative relation to the plurality of scan chains and the filter, wherein the override circuitry includes at least one of means for masking bits from the plurality of scan chains and means for disabling the filter.

A method of filtering test values output by a scan chain is also provided. The scan chain forms part of a built-in self-test architecture for testing a design. The method can include gating the test values provided by the scan chain and controlling the gating by providing signals corresponding to the test values. Controlling the gating can include generating a first predetermined signal if a test value is an uncertain bit.

Controlling the gating can further include generating a second predetermined signal if a test value is a fault bit.

BRIEF DESCRIPTION OF THE DRAWINGS

FIG. 7A illustrates one embodiment of a filter of the invention including override circuitry for both too many Uncertain bits and zero Uncertain bits in a single scan chain.

DETAILED DESCRIPTION OF THE DRAWINGS

In accordance with one embodiment, a deterministic BIST architecture includes a PRPG shadow that eliminates the cycle overhead associated with re-seeding of the PRPG-LFSR. Two compressions can be performed. In a first compression, a pattern for multiple fault detection is generated. In a second compression, a seed based on multiple patterns is generated. By using these two compressions, the data volume associated with the seeds of the PRPG-LFSR can be dramatically reduced.

PRPG Shadow Registers Reduce Test Application Time

Figure 1A:
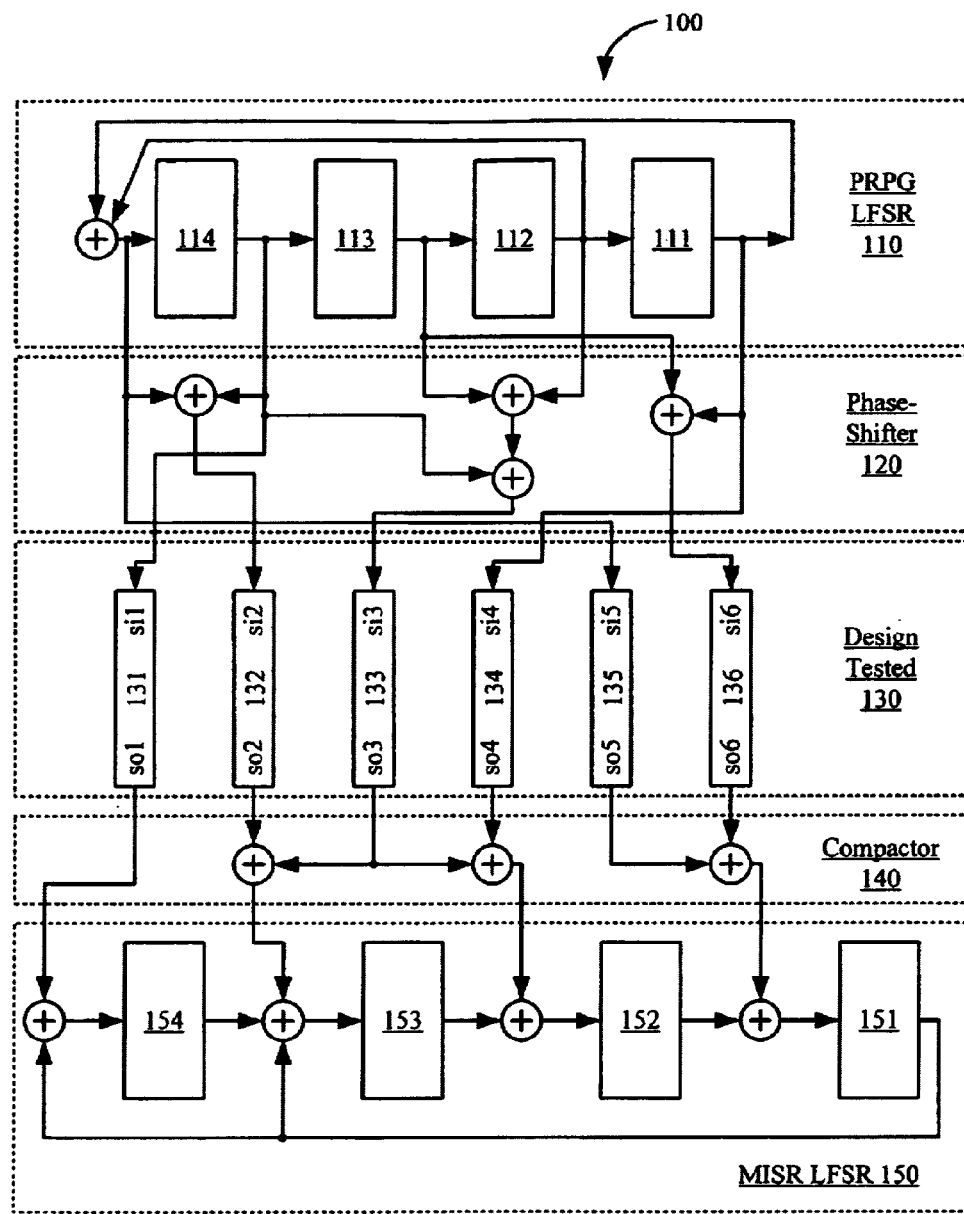
FIG. 1A illustrates a built-in self-test architecture for providing pseudorandom pattern generation.
Figure 1B:
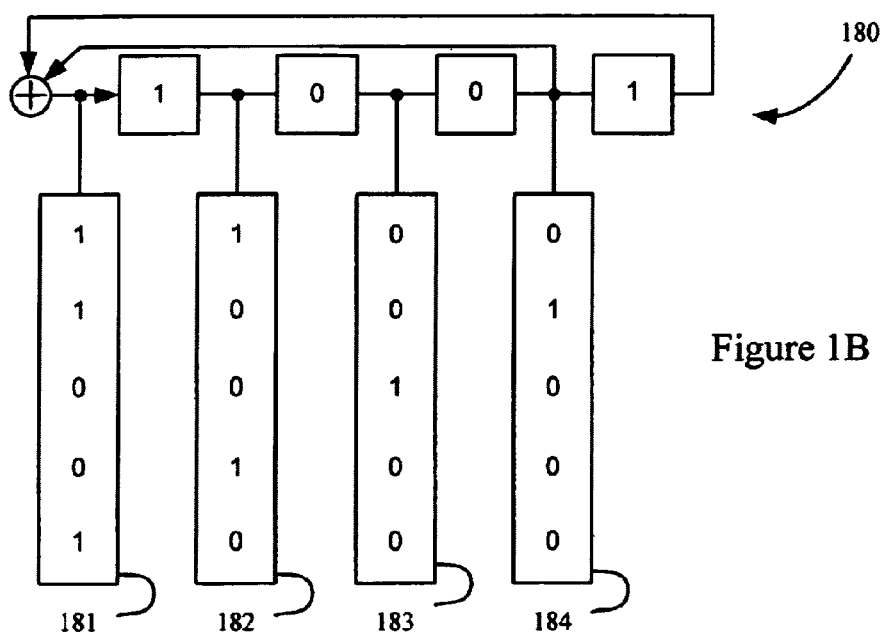
FIG. 1B illustrates an LFSR generating bit sequences for a plurality of scan chains.
Figure 1C:
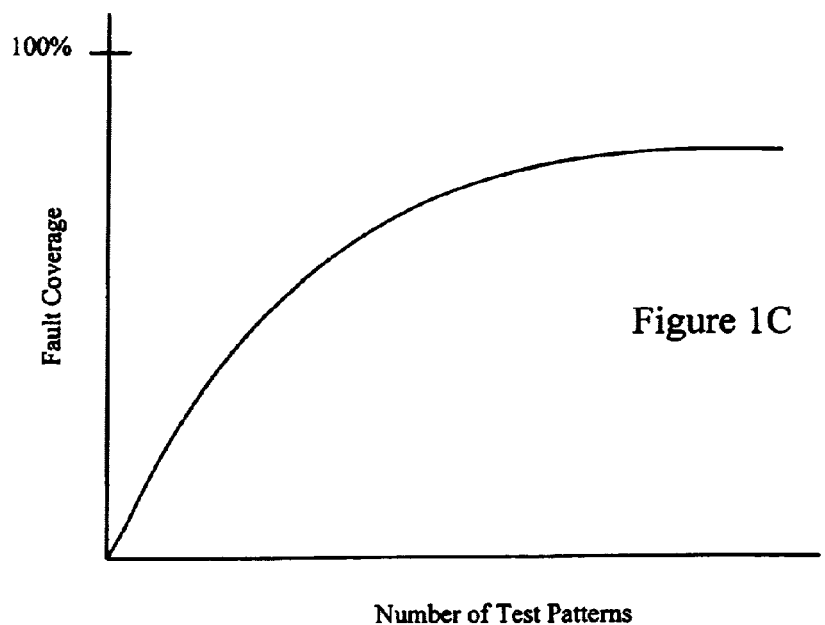
FIG. 1C illustrates a graph plotting fault coverage versus number of test patterns.
Figure 2A:
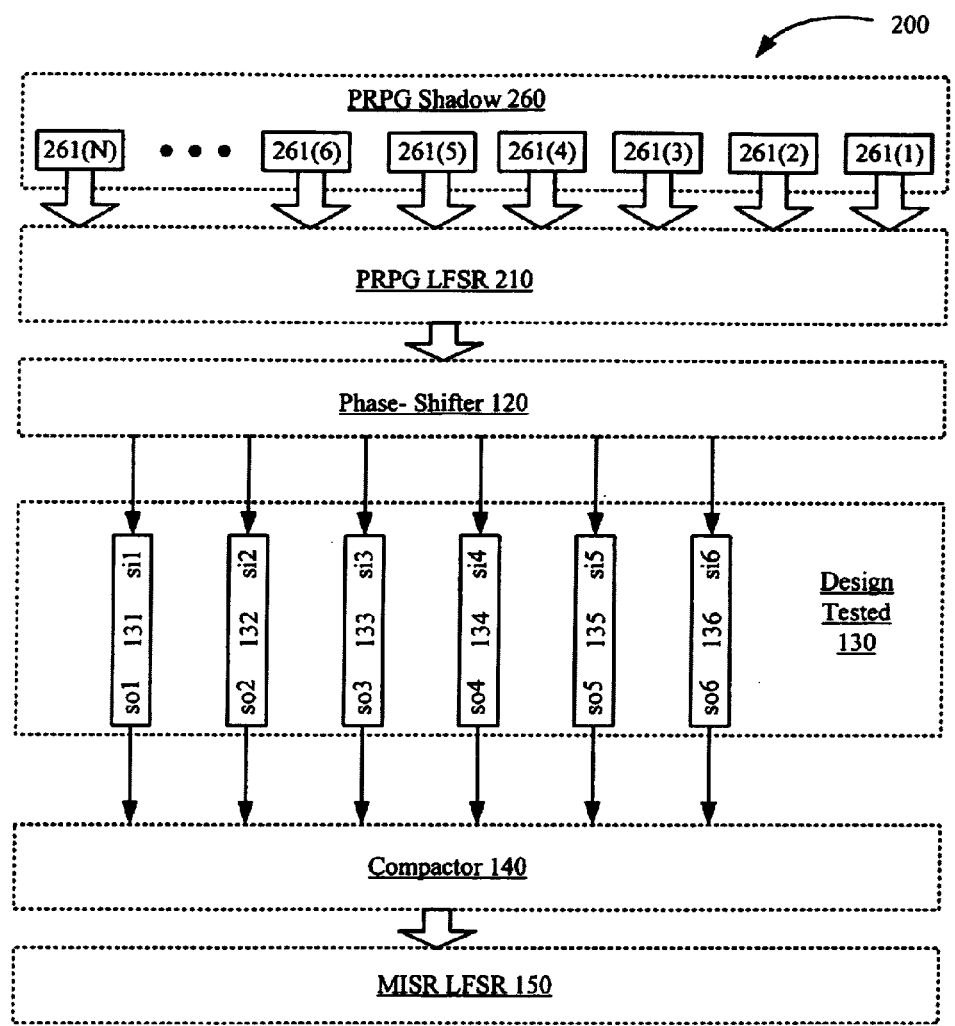
FIG. 2A illustrates a built-in self-test architecture including a PRPG shadow for seeding a PRPG-LFSR in accordance with the present invention.

FIG. 2A illustrates a logic BIST architecture 200 in which a PRPG-LFSR 210 selectively receives signals from a PRPG shadow 260. PRPG shadow 260 includes N PRPG shadow registers 261, wherein each shadow register includes M serially coupled storage elements (not shown, but explained in further detail in reference to FIG. 2B)(wherein both N and M are integers greater than 2). Of importance, the total number of storage elements in PRPG shadow registers 261, i.e. N×M storage elements, is equal to the number of storage elements in PRPG-LFSR 210. PRPG shadow registers 261 can be loaded in parallel. Thus, the number of clock cycles to load these shadow registers is equal to the number of storage elements in each shadow register, i.e. M.

To determine the values of N and M, the number of care bits to be set as well as the longest length of the scan chains of tested design 130, i.e. scan chains 131–136, should be considered. The length of PRPG-LFSR 210 (N×M) minus 10 approximately equals the maximum number of care bits that may be set for a single seed, which may be used for a plurality of patterns. Moreover, during the last stages of testing approximately 240 care bits may be needed to be set within a single pattern. Therefore, in one embodiment, 256 storage elements are provided in PRPG-LFSR 210 (wherein 256−10>240). Thus, because the total number of storage elements in PRPG shadow 260 is equal to the number of storage elements in PRPG-LFSR 210, N×M should be equal to 256.

In one embodiment, each scan chain 131–136 includes 32 scan cells, thereby requiring 32 clock cycles to provide outputs from the seed provided by PRPG-LFSR 210 (via phase shifter 120). Note that other embodiments can include more or less scan cells per scan chain. In accordance with one feature of the present invention, PRPG shadow 260 can be fully loaded in the number of clock cycles it takes to load scan chains 131–136 (in this embodiment, 32 clock cycles). To provide this loading characteristic, the number (M) of storage elements in each PRPG shadow register 261 can be set to 32. Therefore, in this embodiment, 8 PRPG shadow registers 261 can be provided in PRPG shadow 260 (256÷32=8=N).

Figure 2B:
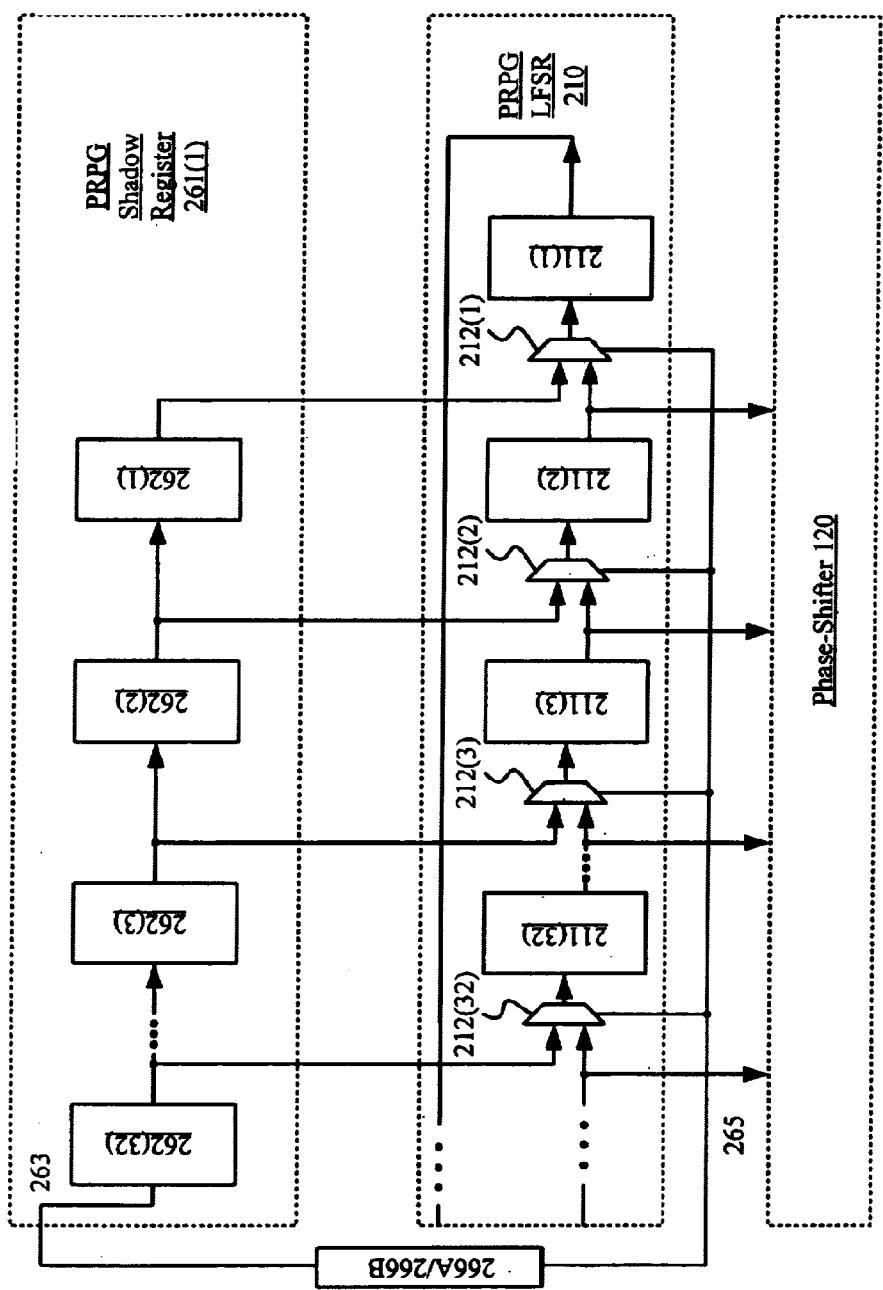
FIG. 2B illustrates one embodiment of a shadow register of the PRPG register and a portion of the PRPG-LFSR of the present invention.

FIG. 2B illustrates a PRPG shadow register 261(1) and a portion of PRPG-LFSR 210 in greater detail. In the above-described embodiment, PRPG-LFSR 210 includes 256 storage elements 211. In FIG. 2B, for simplicity, only 32 storage elements (in one embodiment, flip-flops) 211 are indicated. PRPG-LFSR 210 further includes a plurality of multiplexers 212, wherein each multiplexer 212 provides an output signal to an input terminal of an associated storage element 211. Thus, 256 multiplexers 212 can be provided in one embodiment of PRPG-LFSR 210. Note that PRPG-LFSR 210 can include various feedback loops to implement desired polynomials. However, in FIG. 2B, once again for simplicity, only one feedback loop coupled to the output of storage element 211(1) is shown. Advantageously, by using multiplexers 212, PRPG-LFSR 210 can function as a standard pseudorandom pattern generator, i.e. provide pseudorandom patterns by propagating bits in storage elements 211, or receive new seeds from PRPG shadow register 261(1). In PRPG shadow register 261(1), storage elements 262(1)–262(32) can be loaded using a scan-in line 263. These storage elements 262(1)–262(32) can then provide output signals to multiplexers 212(1)–212(32), respectively, of PRPG-LFSR 210. Note that PRPG shadow registers 261(2)–261(8) have a similar configuration to PRPG shadow register 261(1) and therefore are not explained in detail herein. PRPG shadow registers 261(1)–261(8) are referred to collectively as PRPG shadow registers 261.

A segment of a seed can be loaded into each of PRPG shadow registers 261. Thus, by loading PRPG shadow registers 261 in parallel, PRPG shadow 260 can provide a new seed to PRPG-LFSR 210 in only M clock cycles (in this embodiment, 32 clock cycles). Note that in the prior art, such as that described by B. Könemann in 1991, new seeds can be loaded in parallel. However, the re-seeding and scan chain loading are done serially. Therefore, in the preferred implementation described by Könemann including a 256 PRPG, 16 scan-in pins, and scan chains of length 300, a total of 316 scan clock cycles are necessary. In contrast, and as described in further detail below, PRPG shadow registers 261, PRPG-LFSR 210, and the scan chains can be loaded in parallel, thereby dramatically reducing the overhead associated with the Könemann PRPG.

Multiplexers 212 in PRPG-LFSR 210 can be controlled by a single control signal provided on transfer line 265. In one embodiment, an external tester 266A can provide the seed segment to scan-in line 263 of PRPG shadow register 261(1) as well as the control signal to transfer line 265. In another embodiment, an on-chip controller 266B can provide the control signal to transfer line 265 and trigger a memory access to provide the appropriate seed segment to scan-in line 263. The memory could include any standard non-volatile memory cell array, thereby allowing the IC to conduct a self-test without external assistance.

The new seed that is loaded into PRPG shadow 260 can be advantageously transferred at any time to PRPG-LFSR 210. Specifically, to use a first seed for multiple patterns, the transfer of a second seed stored in PRPG shadow registers 261 into PRPG-LFSR 210 is simply delayed until the first seed has been used for the desired number of patterns. For example, assume that the clocks of storage elements 211 in PRPG-LFSR 210, storage elements 262 in PRPG shadow register 260, and the scan cells in scan chains 131–136 are pulsed at the same time. In this embodiment, the on-chip controller could include a 32-bit counter, which provides the control signal on transfer line 265 after every 32 clock cycles. In this manner, PRPG-LFSR 210 would generate 32 patterns from every seed introduced by PRPG shadow registers 261.

In other words, by using multiplexers 212, a new seed can be advantageously provided for every X patterns, wherein X is an integer greater than or equal to one. In this manner, full overlap of three seeds in different stages can be provided. Specifically, a seed i provided in PRPG-LFSR 210 can be loaded into scan chains 131–136, a seed i+1 (i.e. a subsequent seed to seed i) can be loaded into PRPG shadow 260, and captured values in scan cells s01–s06 generated by a seed i−1 (i.e. a previous seed to seed i) can be unloaded from scan chains 131–136. Thus, seeds i, i+1, and i−1 can all be processed simultaneously by architecture 200. A system can easily implement this fully optimized architecture with minimal silicon overhead on any integrated circuit.

Compression of Deterministic ATPG Patterns Reduces Data Storage and Test Application Time In test pattern generation, although the first few patterns detect the majority of the faults, considerably more patterns are needed to detect the remaining faults. Often, over 50% of the total number of patterns are generated to test these remaining faults. Detection of each of these remaining hard-to-detect faults could require setting a predetermined number of the scan cells (e.g. in the range of 30–60) in the scan chains to particular values, which is very unlikely to occur in random pattern generation. For this reason, it is desirable to supplement pseudorandom pattern generation with deterministic ATPG.

However, because the conditions required to test each of the hard-to-detect faults can be mutually incompatible (e.g. setting a scan cell to different logic values), a single ATPG pattern can typically only test a limited number of these faults. In fact, it is not uncommon for one ATPG pattern to be provided for only one or a few (e.g. less than 10) hard-to-detect faults. Because each prior art ATPG pattern would function as a separate seed in architecture 200, most of the bits in the seed could remain unused. For example, as noted above, a 256-bit LFSR seed can set about 240 scan cells to desired values. If an ATPG pattern generated for testing a hard-to-detect fault requires that 40 scan cells be set to specific values, then 200 bits would be left unused in the seed. Therefore, during testing of hard-to-detect faults, standard ATPG wastes many bits in the seed.

In accordance with one embodiment, these previously wasted bits can be advantageously used to satisfy the required scan cell values for additional patterns. Specifically, multiple ATPG patterns can be very tightly compressed into one seed, thereby significantly increasing the bit utilization for the seed. This feature is particularly desirable for the large number of patterns that previously could detect only a few faults each.

Note that using a large PRPG-LFSR, i.e. over 200 storage elements, ensures that faults requiring a large number of scan cells to be set can be tested. Of importance, a double compression technique, i.e. testing for multiple faults per pattern, if possible, and providing multiple patterns per seed, allows full utilization of the PRPG-LFSR.

Figure 3A:
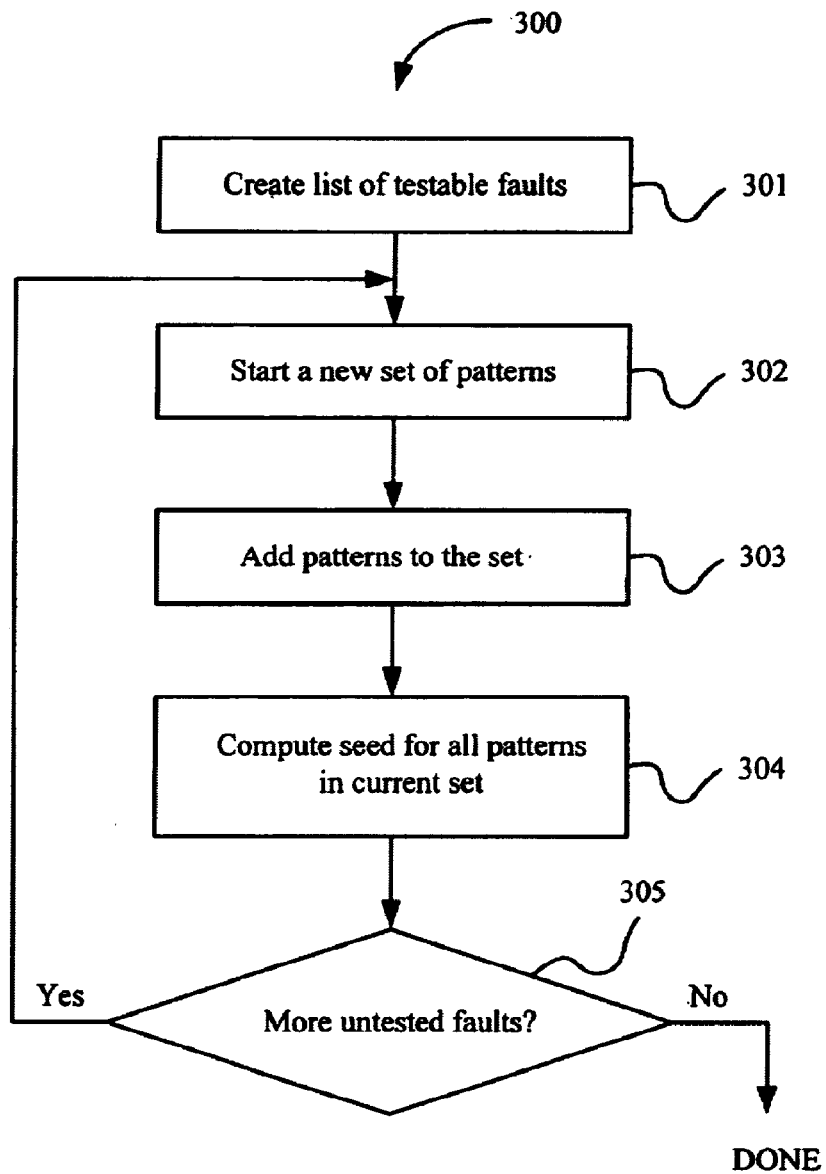
FIG. 3A illustrates a flow chart of a general test process that can be used in the embodiments of the present invention to compute seeds for detecting faults in a design.
Figure 3B:
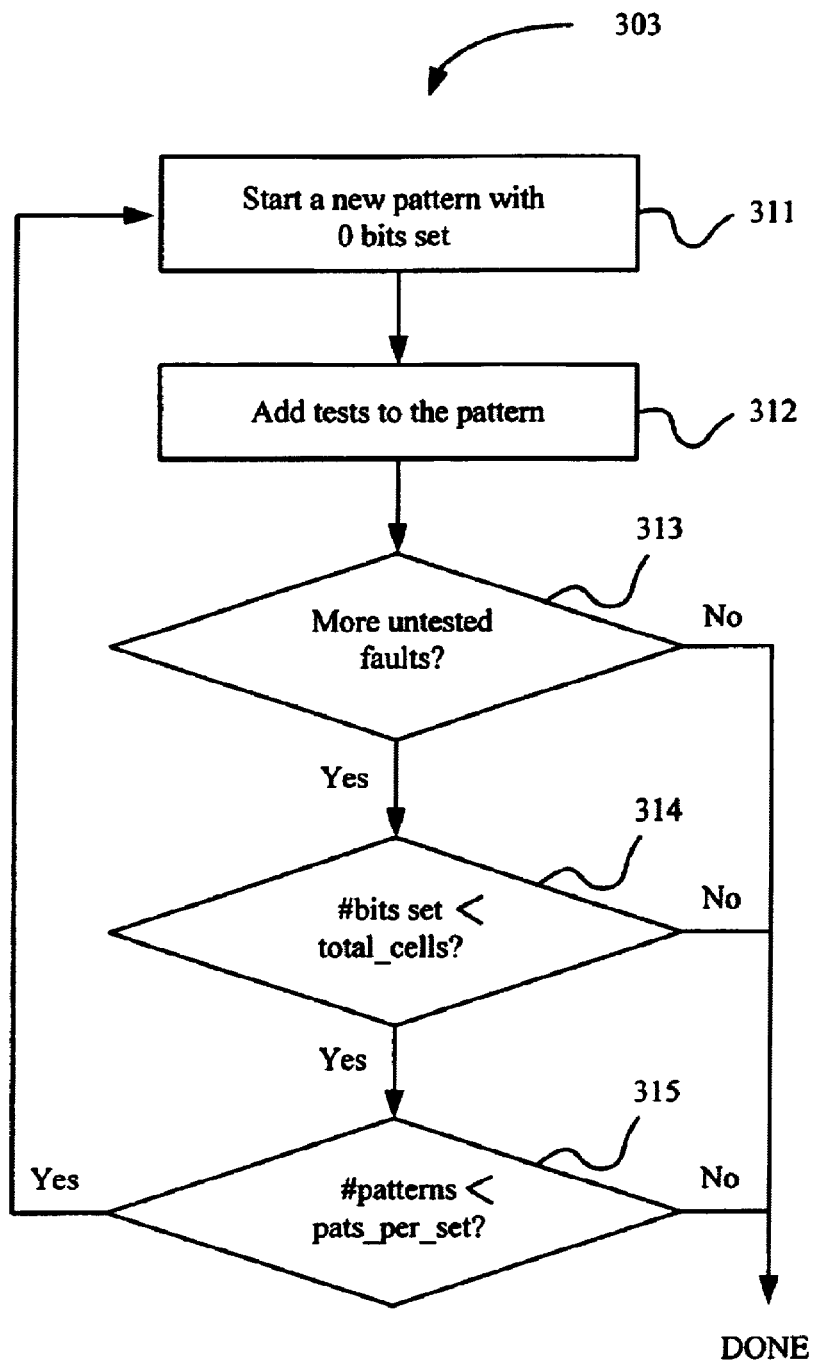
FIG. 3B illustrates a more detailed flow chart of the test process step of adding patterns to a seed.
Figure 3C:
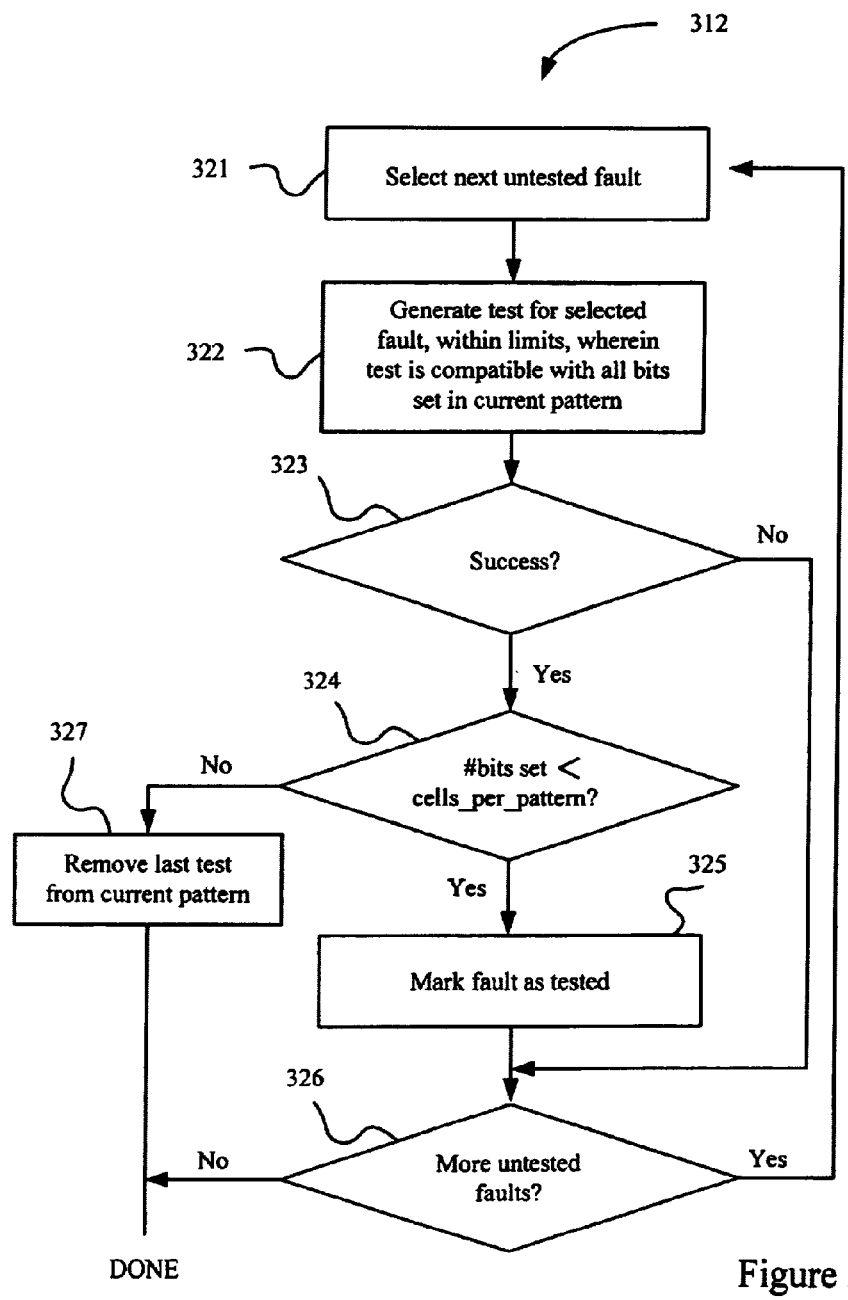
FIG. 3C illustrates a more detailed flow chart of the test process step of adding tests to a pattern.

FIGS. 3A–3C illustrate flow charts for generating a seed for multiple patterns. FIG. 3A illustrates an overview of one seed generation process 300. In step 301, a list of testable faults can be created. A new set of patterns to test these faults can be started in step 302. Patterns are added to the set in step 303 as appropriate (explained in further detail below in reference to FIGS. 3B and 3C). At this point, a seed can be computed for the patterns in the current set in step 304. Finally, if more untested faults are present, as determined in step 305, then steps 302–305 are repeated until no untested faults are left.

Note that in standard deterministic ATPG, step 304 would be eliminated. In that methodology, standard deterministic ATPG would continue to add patterns to the set until all faults are tested. Thus, as described above, deterministic ATPG results in a large number of patterns, wherein each pattern is essentially a seed. In contrast, step 304 can provide multiple patterns per seed, thereby significantly reducing the required data storage. The mathematical equations for computing multiple patterns per seed are described in detail in the section herein entitled, "Calculating a Seed for a Set of Patterns".

Referring to FIG. 3B, which describes the step of adding patterns to the set (i.e. step 303), a new pattern can be started with no care bits set in step 311. In step 312, a new test for detecting a fault can be provided to the pattern (explained in further detail in reference to FIG. 3C). If there are remaining untested faults, as determined in step 313, then step 314 can be performed to determine whether the number of care bits set is less than a maximum number of scan cells that can be set for a single seed, total_cells. In a preferred embodiment, the length of PRPG-LFSR 210 minus ten is approximately equal to total_cells. In the embodiment described above, for a 256-bit LFSR, total_cells could be set to approximately 240. If the number of care bits set is less than total_cells, then step 315 can be performed to determine if the number of patterns is less than a predetermined number of patterns per set, pats_per_set, wherein a set includes a collection of patterns for which a seed is computed. In one embodiment, pats_per_set is used during the computation of the seed. See, Equations 3 of "Calculating a Seed for a Set of Patterns". If the number of patterns is less than pats_per_set, then steps 311–315 can be repeated until either no more untested faults are found (step 313), the number of care bits set is not less than total_cells (step 314), or the number of patterns is not less than pat_per_set (step 315), at which point the step of adding patterns to the set is complete.

Referring to FIG. 3C, which describes the step of adding a test to a pattern (i.e. step 312), the next untested fault can be selected in step 321. In step 322, a test for the selected fault, within limits, can be generated, wherein the test is compatible with all the care bits set in the current pattern. Note that under certain circumstances, a test cannot be generated that is compatible with the care bits already set in the pattern. Furthermore, even if computationally possible, generating the test may prove to be too time consuming. Therefore, in some embodiments, time limitations can be included to improve system performance. Thus, in step 322, the clause "within limits" can take into account computational impossibility and/or inefficiency. Step 323 determines whether the test has been successfully generated in view of these set limitations. If it is successful, then step 324 determines whether the number of care bits in the set is less than a set number of cells in the pattern, cells_per_pattern. This limitation is less than the value of total_cells and establishes a guide for the system of the embodiments of the present invention to give up trying to place additional tests within one pattern.

Typically, cells_per_pattern can be within a range of 10%–20% less than the value of total_cells. In the embodiment for the 256-bit LFSR, cells_per_pattern can be set to approximately 200 (240–(240×0.17)). Step 324 ensures that unnecessary time is not spent on the last 10%–20% of the faults that prove to be extremely difficult to generate associated tests compatible with the care bits set in the current pattern. In this manner, the test compression operation can provide optimal performance.

If the number of care bits set is less than cells_per_pattern, then the fault is marked as tested in step 325. If more untested faults are identified in step 326, then the process returns to step 321 to select the next untested fault. If all faults are tested, then step 312 is complete.

If the test for the selected fault cannot be generated in view of the set limitations, as determined in step 323, then the process proceeds directly to step 326, which determines whether more untested faults are identified. In this manner, maximum compression can be achieved by placing as many tests with compatible care bits into one pattern. As previously noted, this compression is limited by the value of cells_per_pattern in step 324, wherein if the number of care bits set is equal to or greater than cells_per_pattern, then that test is removed from the current pattern in step 327 and step 312 is complete.

Calculating a Seed for a Set of Patterns

A seed can be computed for a set of ATPG-calculated patterns. Each pattern requires that certain scan cells be set to given values as provided by PRPG shadow 260 and PRPG-LFSR 210. Let $v_1$ be the initial state of PRPG-LFSR 210, i.e. the seed provided by PRPG shadow 260, and S be the n×n transition matrix of PRPG-LFSR 210 that implements a polynomial of degree n. The state of PRPG-LFSR 210 after k cycles can be written as:

$$v_{k+1} = v_1 S^k$$

Each of the m phase shifter outputs is a linear combination (XOR) of several PRPG-LFSR bits. The phase shifter can be described by the n×m matrix $$\Phi = [\phi_{ij}]$$

wherein $\phi_{ij}$ is 1 if input i is connected to the XOR function of output j; each column $\phi_j$ of the matrix represents an output j. Therefore, the outputs of the phase shifter (and inputs to the scan chains) after exactly k cycles can be described by the vector:

$$v_{\phi k+1} = v_{k+1} \Phi = v_1 S^k \Phi \quad \text{(Equation 1)}$$

To satisfy all pattern requirements that certain scan cells be loaded to given values $\alpha_i$, the inputs of the scan chains must satisfy the equations:

$$v_{\phi k+1} = [\alpha_1 \alpha_2 \ldots \alpha_m] = M_{\alpha k+1} \quad \text{(Equation 2)}$$

From Equations 1 and 2, $$v_1 S^k \Phi = M_{\alpha k+1} \quad \text{(Equation 3)}$$

$M_{\alpha k+1}$ contains values in each position and for each value of k that is calculated. The required bits in the plurality of scan cells of tested design 130 that are needed are filled in as 0's or 1's in their appropriate positions in $M'_{\alpha k+1}$ as shown below in Equation 3A. The other cells, which are not required, are not part of this equation and are left out.

$$v_1 S^k \Phi = M'_{\alpha k+1} \text{ for } k=0 \text{ to } h-1 \quad \text{(Equation 3A)}$$

The seed $v_1$ can be computed from the subset of Equation 3, i.e. Equation 3A, considering all values of k from 0 to h–1. To compute a seed for a single pattern, h is equal to the number of shifts to load scan chains 131–136. In one embodiment, to compute a seed for pats_per_set patterns, h is the product of the number of shifts to load scan chains 131–136 and pats_per_set, wherein the system of Equations 3 is assumed to comprise all care bits in the pats_per_set patterns.

For large n, m, and h, creating the system of Equations 3 can be more CPU-time consuming than solving the equations. Therefore, in accordance with one embodiment, the method of the embodiments of the present invention pre-calculates and stores data that can be used later to create, with minimal computation, an alternative system of equations. At that point, Gaussian elimination can be used to solve the equations. This method is based on the observation that any seed $v_1$ is a linear combination of the basis seeds:

$$\Gamma_1 = [1 0 \ldots 0]$$

$$\Gamma_2 = [0 1 \ldots 0]$$

$$\ldots$$

$$\Gamma_n = [0 0 \ldots 1]$$

so that $$v_1 = \sum_{i=1}^{n} \beta_i \Gamma_i \quad \text{(Equation 4)}$$

From Equations 3 and 4, $$\sum_{i=1}^{n} \beta_i \Gamma_i S^k \Phi = \sum_{i=1}^{n} \beta_i (\Gamma_i S^k \Phi) = \sum_{i=1}^{n} \beta_i M_{i_{k+1}} \quad \text{(Equation 5)}$$

$$= M_{\alpha_{k+1}} \text{ for } k = 0 \ldots h-1$$

wherein $M_{ik+1}$ is the k+1 row of the matrix $M_j$, and $M_{ak+1}$ is the same as used in Equations 3 and 3A above. The h× m matrices $M_i$ are computed as follows: the PRPG-LFSR 210 is initialized with the basis seeds Гi, one at a time, and the end values loaded into scan chains 131–136 for each of the pats__per__set patterns are computed and stored. The pats__per__set bits are stored for each basis seed and for each scan cell. This pre-computation is done prior to the pattern set generation algorithm of FIGS. 3A–3C.

To compute a seed for the pattern set calculated in FIGS. 3A–3C, the pre-computed $M_i$ values are used to immediately create the system of Equations 5. These Equations 5 are much simpler than Equations 3A and are quickly solved through Gaussian elimination for $β_i$. But $β_i$ are exactly the coefficients of the desired seed $v_1$, as follows from Equation 4. Thus, seed computation in accordance with the embodiments of the present invention is very efficient and requires an insignificant amount of time in the flow of FIGS. 3A–3C.

Illustrative Implementations

In accordance with one embodiment, PRPG shadow 260, PRPG-LFSR 210, phase-shifter 120, compactor 140, and MISR-LFSR 150 can be implemented as a single library element (e.g. the BIST controller library element). In another embodiment, this library element could also include the on-chip controller for providing the control signal to PRPG-LFSR 210 and the memory access for loading seeds into PRPG shadow 260. In yet another embodiment, PRPG shadow 260, PRPG-LFSR 210, phase-shifter 120, compactor 140, and MISR-LFSR 150 can be implemented as separate library elements. In these embodiments, the library element(s) can be selected during the design process similar to any standard library element. In yet another embodiment, the design could be submitted to a third party, wherein the third party could build PRPG shadow 260, PRPG-LFSR 210, phase-shifter 120, compactor 140, and MISR-LFSR 150 out of standard library elements based on the submitted design.

Note that if the integrated circuit is a programmable logic device (PLD), then the BIST controller could be implemented using standard programmable resources on the PLD. Alternatively, in a PLD, the BIST controller could be implemented as a core (i.e. intellectual property (IP)), wherein the core could include a predetermined set of configuration bits that program the PLD to perform one or more functions. In another embodiment, a core could include source code or schematics, which describe the logic and connectivity of a design. Cores can be provided with an optimally floorplanned layout for specific PLDs. Cores can also be parameterizable, i.e. allowing the user to enter parameters to activate or change certain core functionality. Also note that the BIST controller, or any of its constituent parts, could be implemented in hard logic on the integrated circuit.

The methods described herein can be implemented using software, wherein the software can be stored on any type of appropriate media including a computer hard disk drive, a CDROM, or a server. In one embodiment, a computer running a set of instructions can interface with standard IC design software to ensure that test and pattern compression is optimized. In the computer-implemented embodiment, the software of the embodiments of the present invention can be run on a variety of computer platforms including: a PC using Windows 2000™ or NT™, 4.0 operating system with 128 MB of RAM and a 200 MHz Pentium Pro™ microprocessor, either stand alone or connected to a network, and a SUN™ workstation computer among others.

DBIST Provides Optimal Fault Coverage and Test Application Time

Providing deterministic ATPG patterns to the logic BIST structure of the invention (DBIST) significantly reduces test application time compared to both standard BIST systems and standard deterministic ATPG system. Specifically, as previously described above, loading seeds into a standard BIST system would require loading the PRPG in a serial manner. By using the PRPG shadow having multiple registers that load in parallel, the number of clock cycles can be dramatically reduced. For example, in the embodiments described herein, the standard BIST system would take 256 clock cycles, in addition to the 32 clock cycles required for loading the scan chains of the design, thereby resulting in a 256 clock cycle overhead. In contrast, the PRPG shadow would only take 32 clock cycles, which are fully overlapped with the 32 clock cycles required for loading the scan chains of the design, thereby resulting in no clock cycles overhead. Therefore, providing deterministic ATPG patterns to the logic BIST structure of the invention clearly reduces test application time compared to standard BIST systems.

In standard deterministic ATPG, because the test patterns are provided directly to the scan input pins and read from the scan output pins, this method can be severely limited by the number of pins provided for the IC. Specifically, to minimize test application time, the deterministic ATPG patterns are typically provided simultaneously to the scan input pins. Therefore, in light of the limited number of total pins available on the IC (e.g. 100 scan input and 100 scan output pins) and the desirability of placing all state elements in a scan chain, the resulting scan chains provided on the IC are relatively long.

Figure 4A:
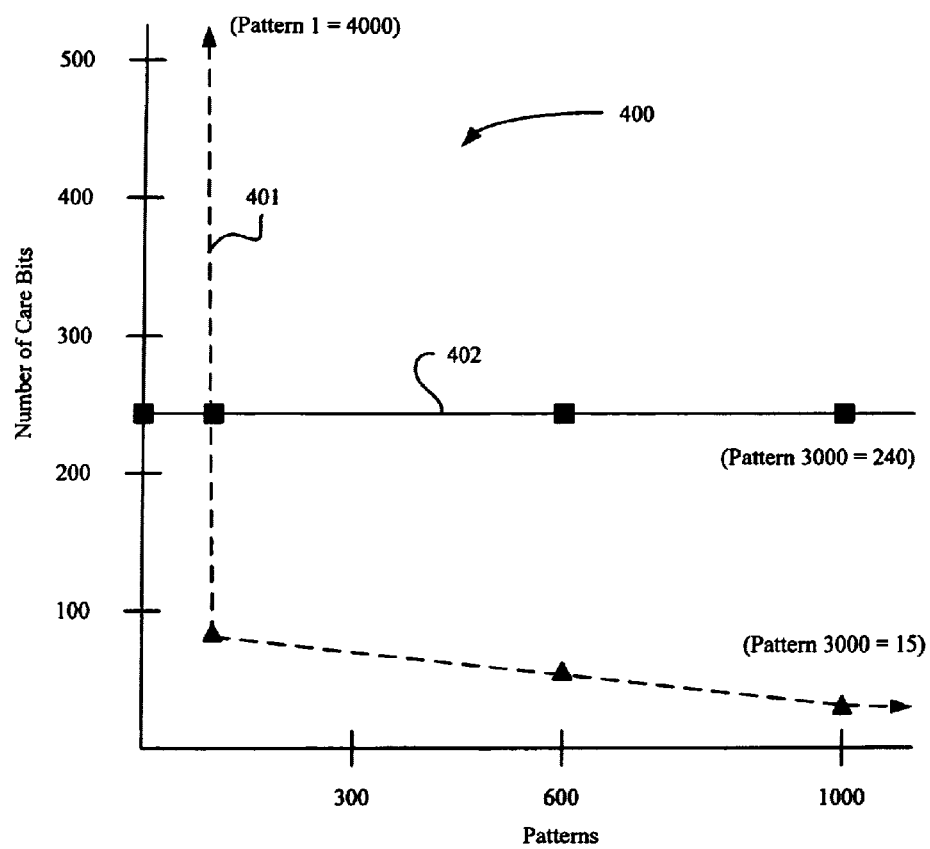
FIG. 4A illustrates a graph comparing the fault targeting efficiency of deterministic ATPG and deterministic BIST.

FIG. 4A illustrates a graph 400 plotting the number of care bits versus patterns. In graph 400, the dashed curve 401 represents the number of care bits that can be provided for each pattern using deterministic ATPG, whereas the solid line 402 represents the number of care bits that can be provided by the invention. Note that although the specific values can vary somewhat depending on the actual IC design or other factors, an analysis of various standard IC designs should yield comparable results to those shown in FIG. 4A.

As known by those skilled in the art, deterministic ATPG is extremely efficient at utilizing care bits while targeting faults in its initial test patterns. For example, a first pattern might utilize up to 4000 care bits. However, after a relatively few number of patterns, the number of care bits that can be utilized is reduced dramatically. Thus, pattern 100 might only be able to utilize 60 care bits and pattern 600 might only be able to utilize 30 care bits. This progressively less efficient method can continue up to the last pattern, e.g. pattern 3000, which might utilize only 15 care bits.

In contrast, as indicated by step 324 in FIG. 3C, a relatively constant number of care bits for every seed can be utilized. In the embodiments described herein, up to approximately 240 care bits can be utilized assuming a 256-bit PRPG is provided. Thus, at some pattern close to pattern 100, more care bits can be utilized than standard deterministic ATPG. In fact, this number of care bits can be utilized up to the last seed.

Of interest, the number of patterns needed might be increased by a factor of two compared to standard deterministic ATPG. In other words, 6000 patterns would be used instead of 3000. However, because at least two patterns are placed in every seed, FIG. 4A is perhaps best appreciated by recognizing that line 402 can represent care bits utilized per seed of the invention.

Moreover, the deterministic BIST structure, i.e. including the PRPG and PRPG shadow, advantageously allows the design under test to be divided into many more scan chains compared to deterministic ATPG, e.g. 512 scan chains compared to 100 for deterministic ATPG. In other words, a scan chain in a deterministic BIST architecture could be five times shorter than a scan chain used in deterministic ATPG. Therefore, using the deterministic BIST architecture, the number of patterns might be increased by a factor of two, but every pattern can be applied in five times fewer clock cycles. Hence, the test application time can be reduced by a factor of two compared to deterministic ATPG.

Thus, in summary, deterministic BIST architecture can provide fault coverage approaching 100% while significantly reducing the test application time compared to both logic BIST and deterministic ATPG.

Filtering Bits From Scan Chains Eliminates Uncertain Outputs

Based on the seed provided to the PRPG shadow, the PRPG LFSR and phase-shifter generate predetermined bit sequences, i.e. the test patterns, for the scan chains of the tested design. The output bits of the scan chains include both Fault bits, i.e. those bits that can indicate faults in the tested design, as well as "Don't Care" bits, i.e. those bits that do not indicate faults in the tested design. These Fault bits and Don't Care bits are provided to the MISR LFSR (via the compactor) for processing. The state of the MISR LFSR can be compared to the known "signature" of the fault-free design, wherein a mismatch indicates that at least one erroneous value was unloaded from the scan chains. This erroneous value can be used to determine that a fault exists in the tested design and where that specific fault is located.

Figure 4B:
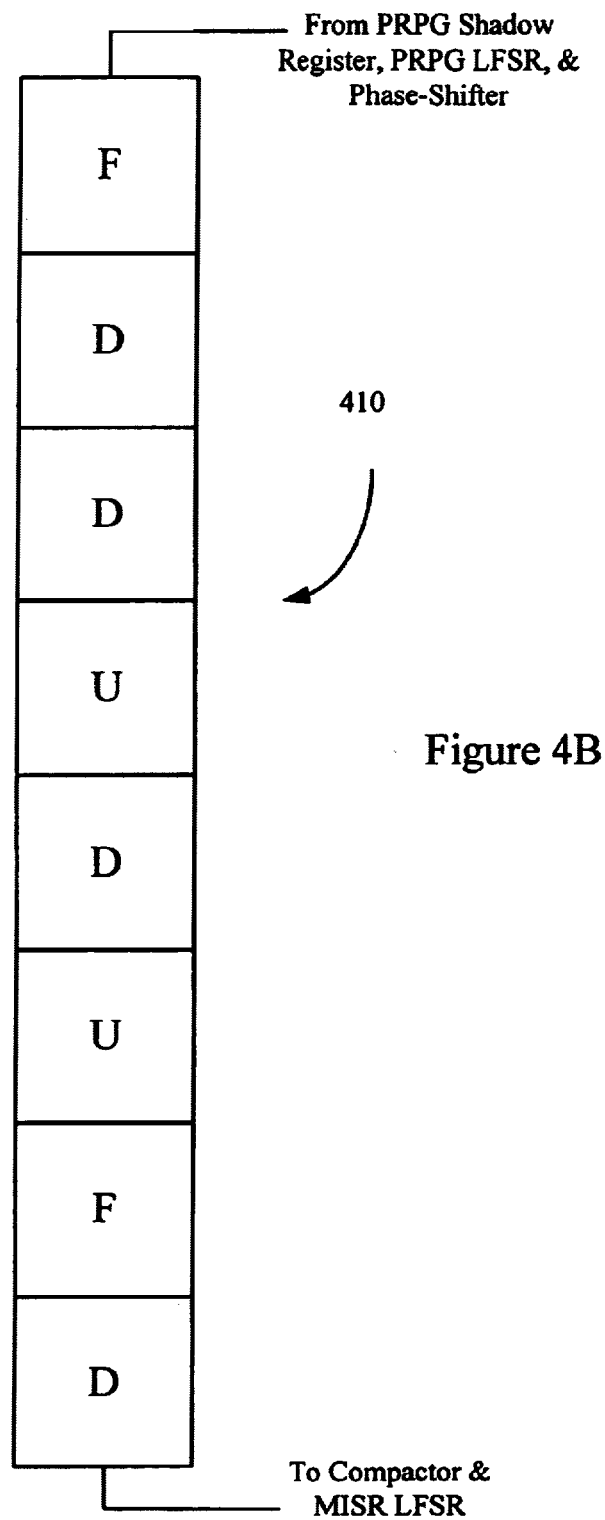
FIG. 4B illustrates a scan chain including fault, don't care, and uncertain bits.

Unfortunately, the tested design can occasionally output Uncertain bits in addition to Fault bits and Don't Care bits. These Uncertain bits have values that are unknown, and thus can corrupt the signature generated by the MISR LFSR. FIG. 4B illustrates a scan chain 410 having a plurality of bits (generated by a seed provided to the PRPG shadow and processed by the PRPG LFSR and phase-shifter). Scan chain 410 includes 8 bits, in which 2 bits are Fault bits, 4 bits are Don't Care bits, and 2 bits are Uncertain bits. In accordance with one feature of the invention, a filter can be used to mask these Uncertain bits before these bits are provided to the MISR LFSR (via the compactor).

Figure 5A:
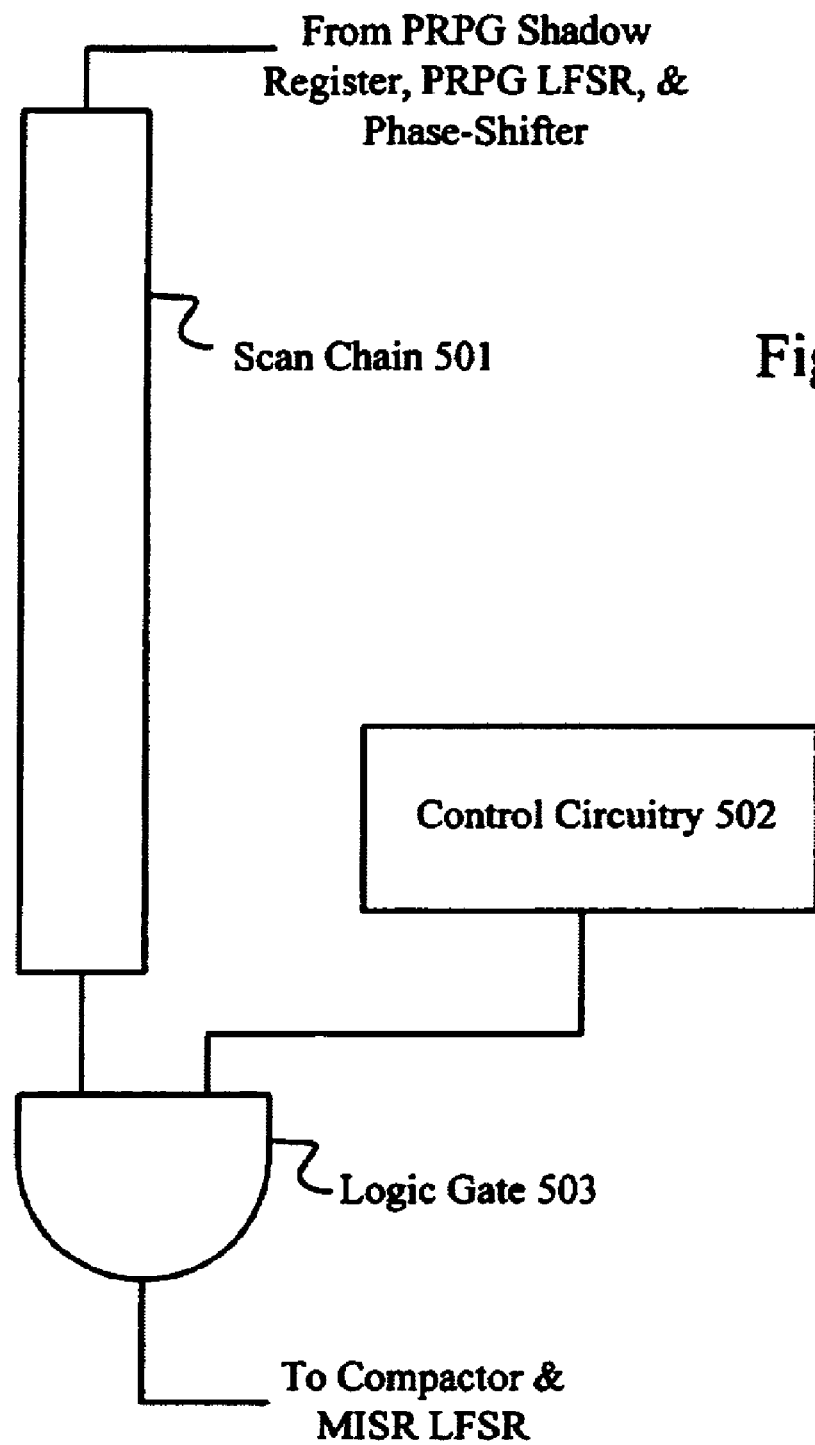
FIG. 5A illustrates a filter of the invention including a gating structure and control circuitry.

FIG. 5A illustrates a filter including a logic gate 503 and control circuitry 502. In this embodiment, logic gate 503 is an AND gate that receives inputs from a scan chain 501 and control circuitry 502. When an output bit of scan chain 501 is determined to be an Uncertain bit (as determined by simulation of the logic feeding this flip-flop), then the control circuitry 502 can output a logic zero signal, thereby forcing the output of logic gate 503 to a known value, i.e. a logic zero. In this manner, the compactor and MISR LFSR can generate a signature that is uncorrupted by any Uncertain bit. In contrast, when an output bit of scan chain 501 is determined to be either a Fault bit or a Don't Care bit, then control circuitry 502 can output a logic one signal, thereby allowing the bit from scan chain 501 to be provided to the compactor and MISR LFSR.

Figure 5B:
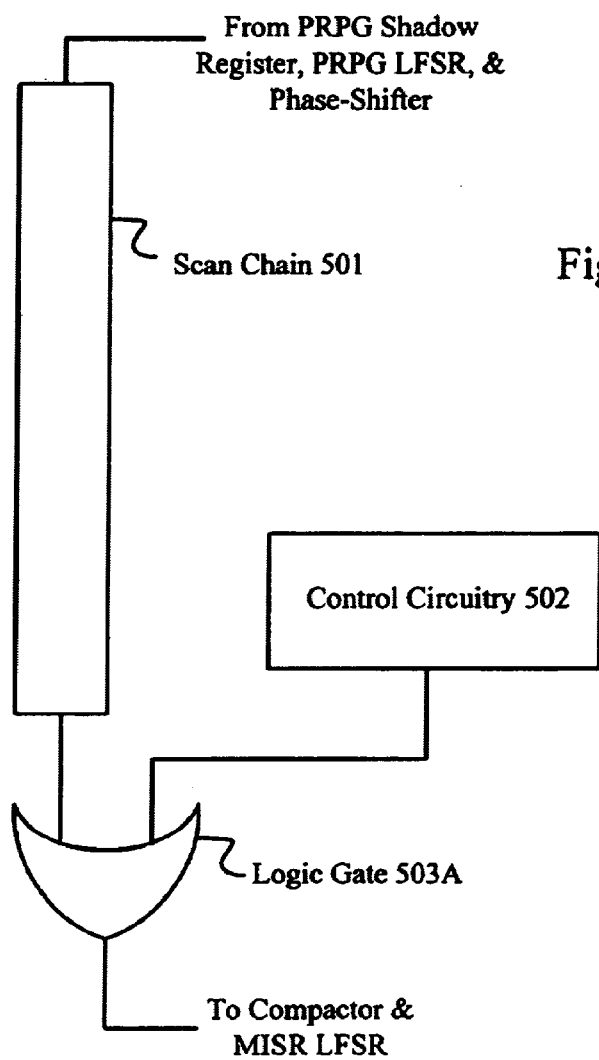
FIG. 5B illustrates another filter of the invention including another gating structure and control circuitry.

Note that other types of logic devices can be used to force Uncertain bits to known values. For example, FIG. 5B illustrates another filter including a logic gate 503A and control circuitry 502. In this embodiment, logic gate 503A is an OR gate that receives inputs from scan chain 501 and control circuitry 502. When an output bit of scan chain 501 is determined to be an Uncertain bit (as determined by simulation of the logic feeding this flip-flop), then the control circuitry 502 can output a logic one signal, thereby forcing the output of logic gate 503 to a known value, i.e. a logic one. In this manner, the compactor and MISR LFSR can generate a signature that is uncorrupted by any Uncertain bit. In contrast, when an output bit of scan chain 501 is determined to be either a Fault bit or a Don't Care bit, then control circuitry 502 can output a logic zero signal, thereby allowing the bit from scan chain 501 to be provided to the compactor and MISR LFSR.

Other logic devices can also be used in lieu of logic gates 503 and 503A. These logic devices could include, but are not limited to, NAND gates, NOR gates, or a combination of logic gates.

Figure 6:
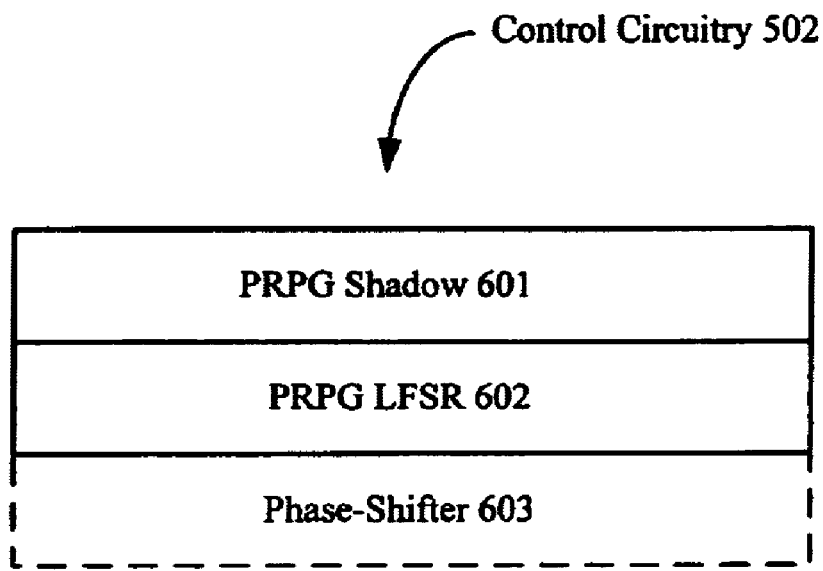
FIG. 6 illustrates exemplary control circuitry, which includes a PRPG shadow, a PRPG LFSR, and a phaseshifter, if necessary.

In one embodiment, control circuitry 502 can include circuitry substantially similar to the circuitry providing signals to the scan chains (see, for example, FIGS. 2A and 2B) that functions substantially in the same way (see, for example, FIGS. 3A–3C). FIG. 6 illustrates exemplary control circuitry 502, which includes a PRPG shadow 601, a PRPG LFSR 602, and an optional phase-shifter 603 (assuming the pattern generator for the scan chains also includes a phase-shifter). In one embodiment, PRPG shadow 601, PRPG LFSR 602, and phase-shifter 603 can have an identical construction to PRPG shadow 260, PRPG LFSR 210, and phase-shifter 120, respectively. In accordance with one feature of the invention, PRPG shadow 601 would receive a seed that ensures any Uncertain bits are not provided to the MISR LFSR.

In another embodiment, control circuitry 502 can include any state machine capable of generating the blocking values (as determined by simulation of the logic feeding each flip-flop) to the block the Uncertain bits. In yet another embodiment, a shift register (also called an instruction register) could also be used to implement control circuitry 502, wherein each flip-flop in the shift register provides a value to the input of a gating device.

Some seeds of the PRPG LFSR may generate more Uncertain bits than other seeds. And more particularly, these Uncertain bits may be output by one scan chain more than other scan chains. In contrast, certain scan chains may only rarely output an Uncertain bit. Therefore, in accordance with one embodiment, override circuitry can be provided to address these conditions.

FIG. 7A illustrates one embodiment of a filter including override circuitry for both too many Uncertain bits and zero Uncertain bits. Specifically, the filter can include a logic gate 702A that receives bits from scan chain 501 as well as override circuitry 701A. In this configuration, override circuitry 701A can essentially deactivate scan chain 501 if too many Uncertain bits are provided in scan chain 501. The filter can further include a logic gate 702B that receives signals from control circuitry 502 (previously described) as well as override circuitry 701B. In this configuration, override circuitry 701B can essentially deactivate control circuitry 502 if there are no Uncertain bits that are provided in scan chain 501.

In this embodiment, logic gates 702A and 702B are OR gates that provide input signals to another logic gate 702C. Logic gate 702C, in this case an AND gate, provides an output to the compactor and the MISR LFSR. Using the above-described logic gates, logic one signals from override circuitries 701A and 701B, respectively, can deactivate scan chain 501 and control circuitry 502. Specifically, a logic one signal output by override circuitry 701A forces the output of logic gate 702A to a predetermined (i.e. logic one) state, thereby effectively deselecting the bit(s) output by scan chain 501 and ensuring that the Uncertain bits present therein cannot corrupt the signature generated by the MISR LFSR. In this case, logic gate 702C receives and transfers the signals from control circuitry 502 to the compactor and MISR LFSR for further processing. On the other hand, a logic one signal output by override circuitry 701B forces the output of logic gate 702B to a predetermined (i.e. logic one) state, thereby effectively disabling control circuitry 502 and allowing the bits present in scan chain 501 to be provided (via logic gate 702C, which receives and transfers such bits) to the compactor and MISR LFSR.

In contrast, logic zero signals output by override circuitries 701A and 701B can activate scan chain 501 and control circuitry 502. In other words, if override circuitries 701A and 701B output logic zero signals, then logic gates 702A and 702B function as buffers that receive and transfer the signals provided by scan chain 501 and control circuitry 502, respectively. Note that if both scan chain 501 and control circuitry 502 are activated, then the filter functions as described in reference to FIG. 5A. Further note that override circuitries 701A and 701B can be implemented separately or in combination in the filter.

Figure 7B:
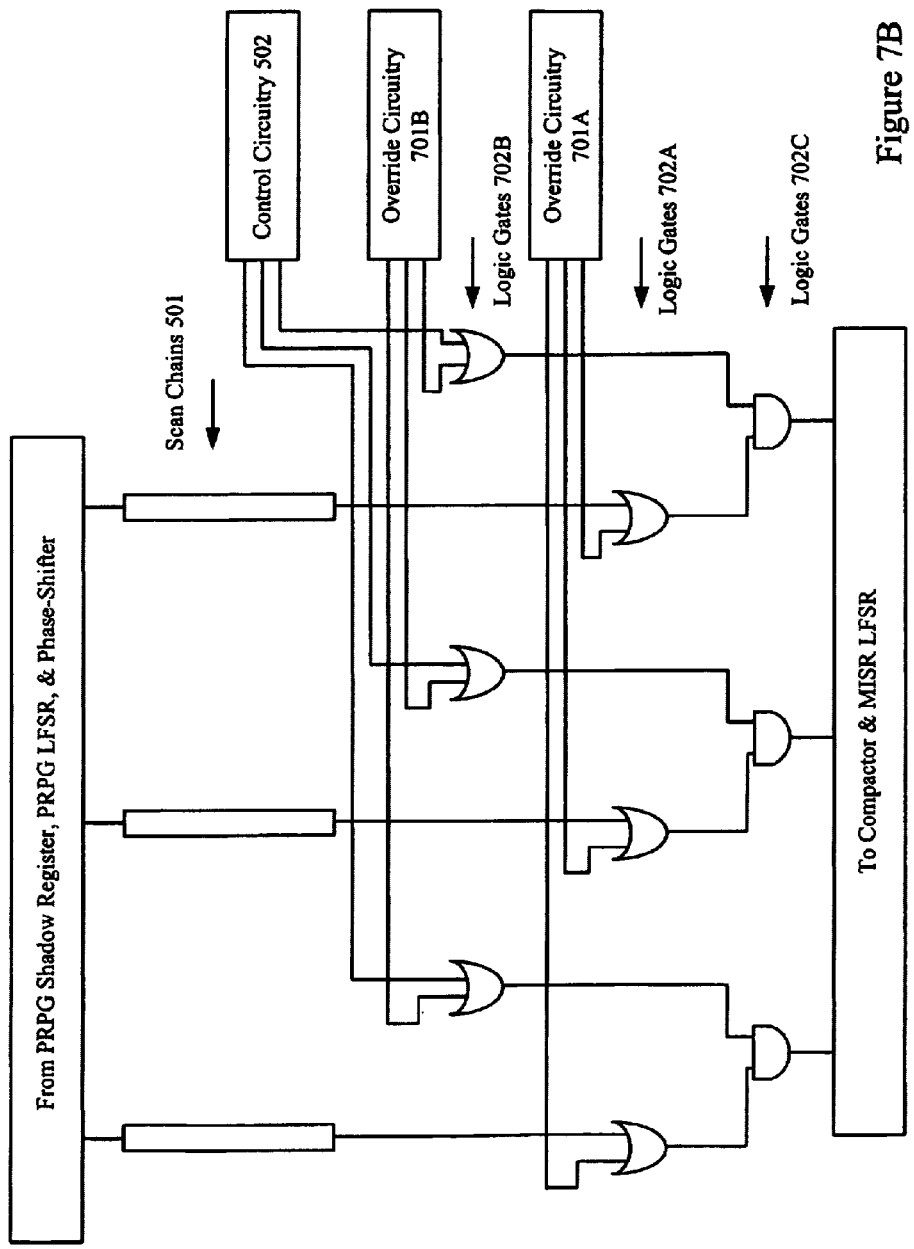
FIG. 7B illustrates a plurality of scan chains and their coupling to a filter of the invention.
Figure 7C:
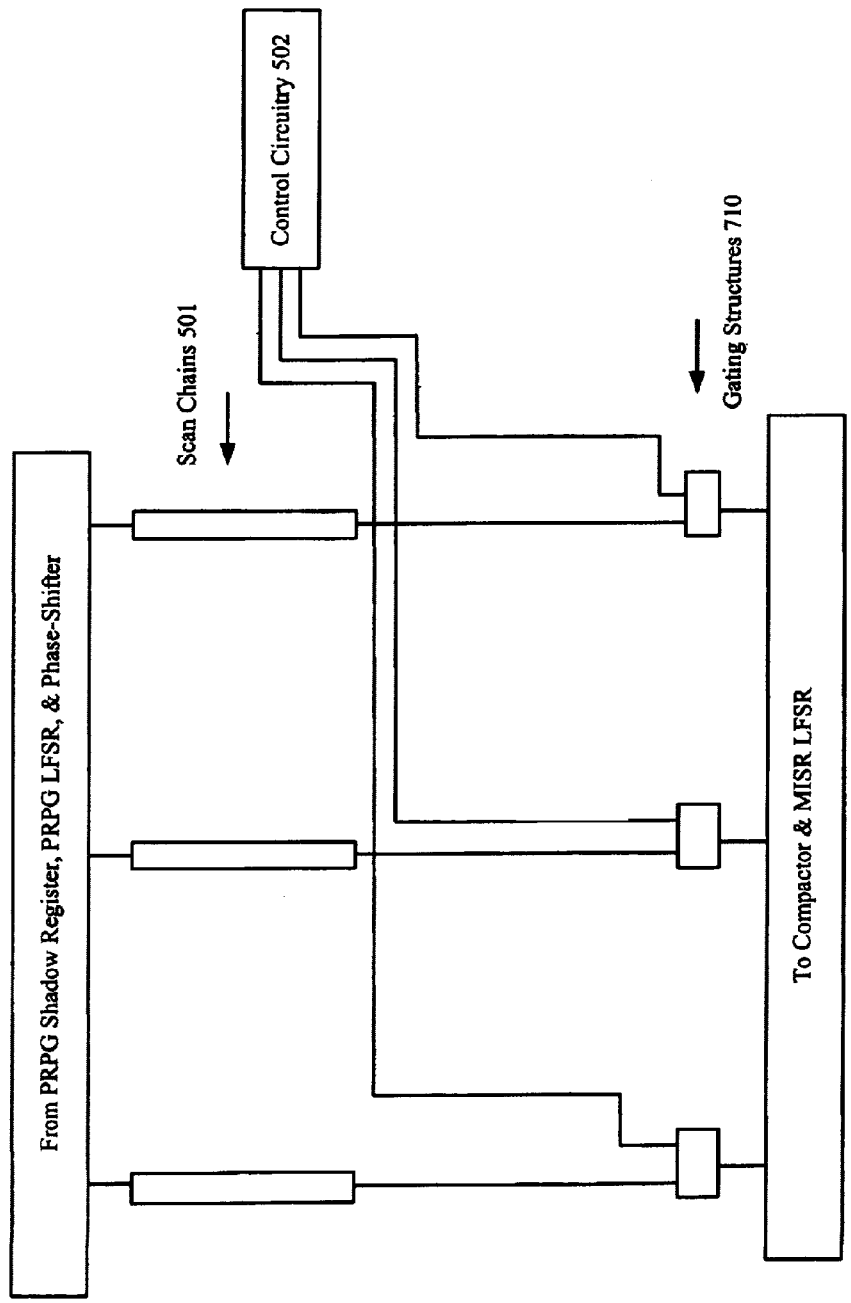
FIG. 7C illustrates a plurality of scan chains and their coupling to another filter of the invention.

FIG. 7B illustrates a plurality of scan chains 501 and their coupling to the filter described in reference to FIG. 7A. FIG. 7C illustrates a plurality of scan chains 501 and their coupling to the simplified filter described in reference to either of FIGS. 5A and 5B. Note that gating structures 710 could include logic gates 503, logic gates 503A, some combination of logic gates, or some other gating structure for masking the Uncertain bits.

Figure 7D:
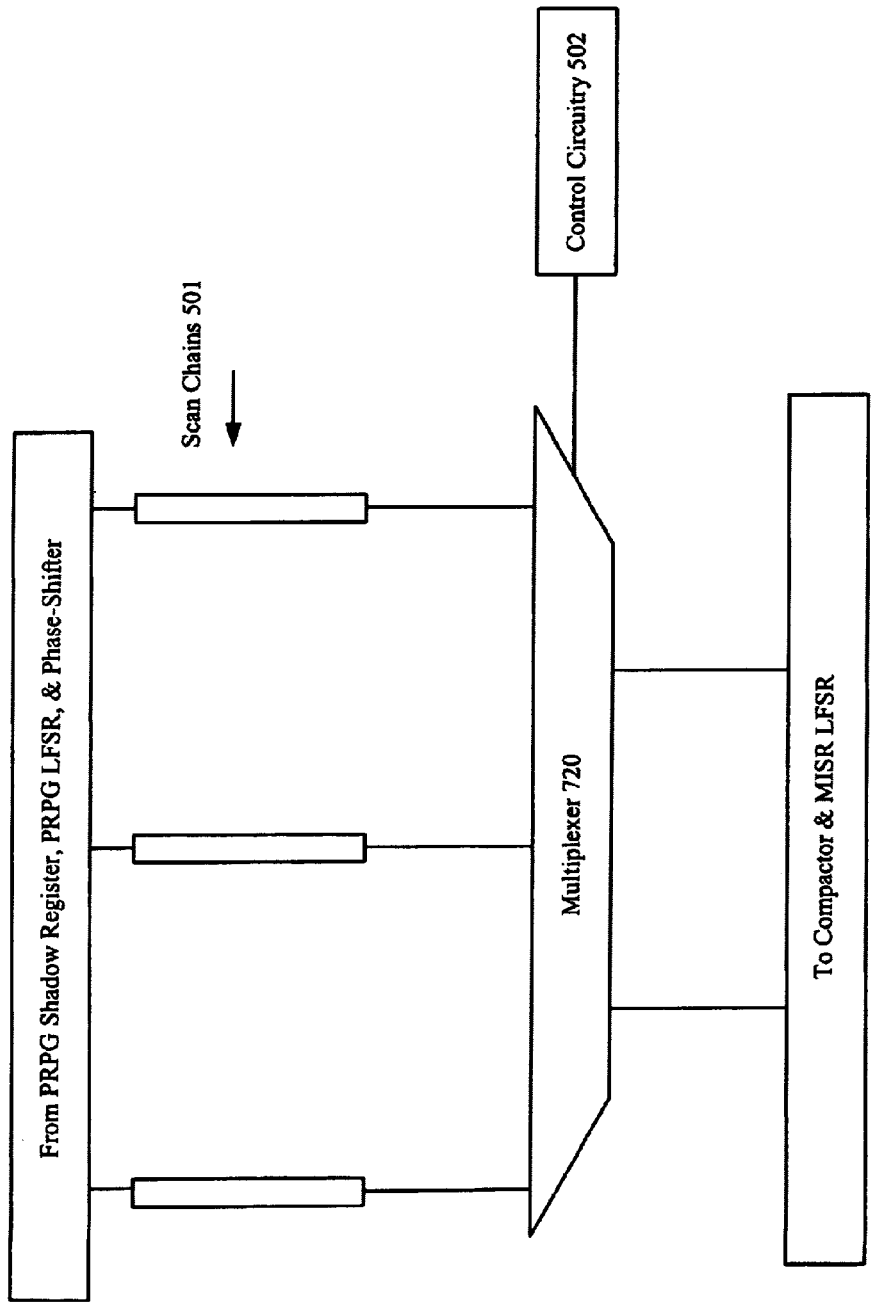
FIG. 7D illustrates another embodiment of a filter of the invention including a multiplexer for bypassing one or more selected scan chains.

FIG. 7D illustrates another embodiment of a filter in which selected scan chains 501 can be bypassed using a multiplexer 720. In this embodiment, multiplexer 720 receives M inputs, i.e. M bits from scan chains 501, and transfers N outputs that will generate the MISR LFSR signature. Control circuitry 502 selects the N of M signals for transfer. In this manner, a filter can essentially bypass any scan chain 501 that outputs an Uncertain bit. Note that the dimensions of multiplexer 720, i.e. the values associated with M and N, can vary from one embodiment to another. However, in general, M is equal to the number of scan chains and M>N.

Figures 8A, 8B:
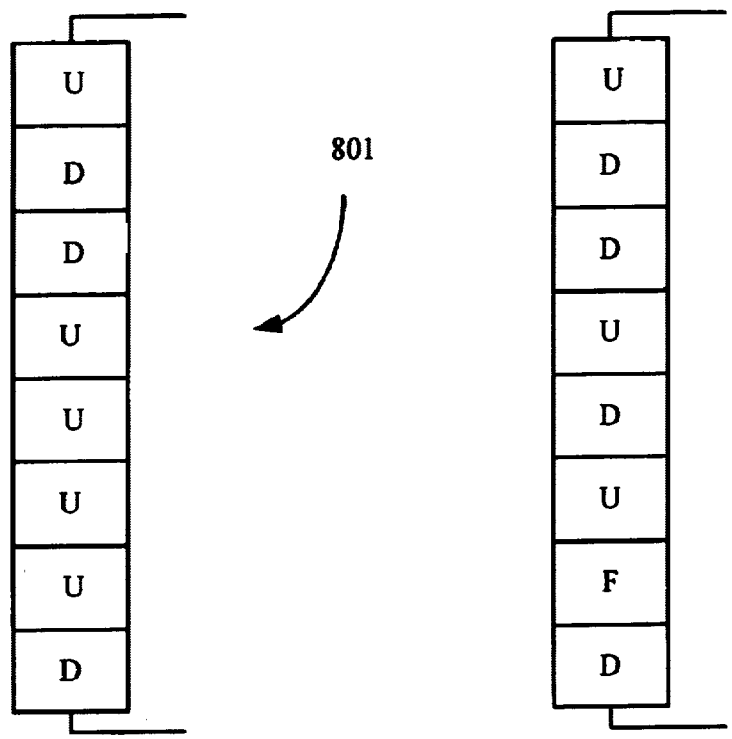
FIGS. 8A, 8B, and 8C illustrate three scan chains with exemplary bits therein.
Figure 8C:
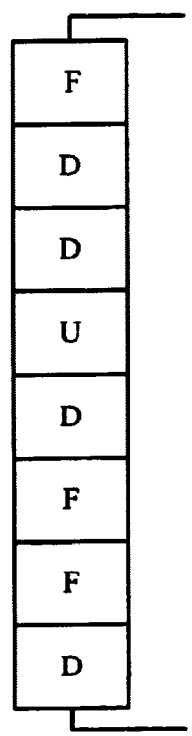

FIGS. 8A, 8B, and 8C illustrate scan chains 801, 802, and 803, respectively, with exemplary bits therein. Specifically, scan chain 801 of FIG. 8A includes predominantly Uncertain bits with a few Don't Care bits. In this case, override circuitry 701A (FIG. 7A) could be used to mask all bits within scan chain 801. Alternatively, multiplexer 720 (FIG. 7C) could be used to bypass scan chain 801 completely. Scan chain 802 includes approximately the same number of Uncertain bits and Don't Care bits, but also includes a Fault bit. In one embodiment, the bits in scan chain 802 can be processed in a similar manner to the bits in scan chain 801, i.e. masked or bypassed for testing efficiency. Specifically, providing the encoding for the processing of this single bit for detecting a fault can be inefficient and resource intensive. Therefore, in one embodiment, this fault can be tested using another seed with less resulting Uncertain bits. Finally, scan chain 803 includes 3 Fault bits, 1 Uncertain bit, and 4 Don't Care bits. In this case, override circuitry 701A (FIG. 7A) could be deactivated, thereby allowing these bits to be provided to logic gate 702C (i.e. a gating structure). Override circuitry 701B can also be disabled, thereby allowing control circuitry 502 to generate the one bit for masking the single Uncertain bit included in scan chain 803.

Other Embodiments

Although illustrative embodiments of the invention have been described in detail herein with reference to the accompanying figures, it is to be understood that the invention is not limited to those precise embodiments. They are not intended to be exhaustive or to limit the invention to the precise forms disclosed. For example, although the pseudo-random pattern generator (PRPG) can be implemented using a linear feedback shift register (LFSR), other types of PRPGs can also be used in the present invention. For example, cellular automata can replace the PRPG-LFSR described herein. The cellular automata, like the PRPG-LFSR, includes a plurality of storage elements serially coupled and providing feedback to XOR functions. However, the cellular automata typically provides its feedback locally, e.g. to storage elements two or three elements to the right or left, whereas the PRPG-LFSR provides its feedback globally, e.g. to storage elements at the other end of the register. In another example, the size of the PRPG shadow, PRPG-LFSR, or the scan chain can vary from one embodiment to another. In one case, the scan chain could include 256 bits. As seen from these illustrative examples, many modifications and variations will be apparent to practitioners skilled in this art. Accordingly, it is intended that the scope of the invention be defined by the following claims and their equivalents.

What is claimed is:

1. A filter for masking an uncertain bit provided in a test scan chain, the filter comprising:
    a gating structure for receiving a bit from the scan chain; and
    control circuitry for providing a predetermined signal to the gating structure if the bit is an uncertain bit, wherein the control circuitry includes an LFSR.

2. The filter of claim 1, wherein the control circuitry further includes a PRPG shadow for loading the LFSR.

3. The filter of claim 2, wherein the control circuitry further includes a phase-shifter for receiving inputs from the LFSR and providing outputs to the gating structure.

4. A filter for masking an uncertain bit provided in a test scan chain, the filter comprising:
    a gating structure for receiving a bit from the scan chain;
    control circuitry for providing a predetermined signal to the gating structure if the bit is an uncertain bit, wherein the control circuitry includes an LFSR; and
    an override component for masking a bit from the scan chain with a predetermined logic value.

5. The filter of claim 4, wherein the override component includes a logic gate for receiving the bit from the scan chain and override circuitry for providing an output to the logic gate, wherein the logic gate provides an output to the gating structure.

6. A filter for masking an uncertain bit provided in a test scan chain, the filter comprising:
    a gating structure for receiving a bit from the test scan chain;
    control circuitry for providing a predetermined signal to the gating structure if the bit is an uncertain bit, wherein the control circuitry includes an LFSR; and
    an override component for deactivating the control circuitry.

7. The filter of claim 6, wherein the override component includes a logic gate for receiving a signal from the control circuitry and override circuitry for providing an output to the logic gate, wherein the logic gate provides an output to the gating structure.

8. A system for testing a design implemented in an integrated circuit (IC), the design including a plurality of scan chains, the system comprising:
- a first set of shadow registers, each shadow register including a first plurality of storage elements serially coupled;
- first means for generating a first pseudorandom pattern, wherein each value stored in the first plurality of storage elements can be selectively provided to one of a second plurality of storage elements in the first means for generating, wherein values of the second plurality of storage elements are used to provide inputs to the plurality of scan chains, and wherein such inputs form the first pseudorandom pattern;
- a filter for eliminating any uncertain output signals of the scan chains; and
- means for providing a signature from output signals of the filter.

9. The system of claim 8, wherein the filter includes:
- a second set of shadow registers, each shadow register including a third plurality of storage elements serially coupled;
- second means for generating a second pseudorandom pattern, wherein each value stored in the third plurality of storage elements can be selectively provided to one of a fourth plurality of storage elements in the second means for generating, and wherein values of the fourth plurality of storage elements are used to form the second pseudorandom pattern; and
- a plurality of logic gates for receiving the second pseudorandom pattern and signals output by the plurality of scan chains.

10. The system of claim 8, further including override circuitry coupled in operative relation to the plurality of scan chains and the filter, wherein the override circuitry includes at least one of means for masking bits from the plurality of scan chains and means for disabling the filter.

11. A method of filtering test values output by a scan chain, the scan chain forming part of a built-in self-test architecture for testing a design, the method comprising:
- gating the test values provided by the scan chain;
- controlling the gating by providing signals corresponding to the test values;
- generating a first predetermined signal if a test value is an uncertain bit; and
- generating a second predetermined signal if a test value is a fault bit.

12. The method of claim 11, wherein controlling the gating further includes:
- generating a logic value if a test value is a "don't care" bit.

* * * * *